United States Patent
Rubin et al.

(10) Patent No.: US 11,094,637 B2
(45) Date of Patent: Aug. 17, 2021

(54) MULTI-CHIP PACKAGE STRUCTURES HAVING EMBEDDED CHIP INTERCONNECT BRIDGES AND FAN-OUT REDISTRIBUTION LAYERS

(71) Applicant: International Business Machines Corporation, Armonk, NY (US)

(72) Inventors: Joshua M. Rubin, Albany, NY (US); Steven Lorenz Wright, Cortlandt Manor, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/675,437

(22) Filed: Nov. 6, 2019

(65) Prior Publication Data
US 2021/0134728 A1   May 6, 2021

(51) Int. Cl.
*H01L 23/538* (2006.01)
*H01L 21/48* (2006.01)
*H01L 25/00* (2006.01)

(52) U.S. Cl.
CPC ........ *H01L 23/5386* (2013.01); *H01L 21/481* (2013.01); *H01L 21/4853* (2013.01);
(Continued)

(58) Field of Classification Search
CPC ............... H01L 21/481; H01L 21/4853; H01L 2224/16225
See application file for complete search history.

(56) References Cited

U.S. PATENT DOCUMENTS

| 5,534,466 A | 7/1996 | Perfecto et al. |
| 8,008,764 B2 | 8/2011 | Joseph et al. |

(Continued)

FOREIGN PATENT DOCUMENTS

| WO | 2017111957 A1 | 6/2017 |
| WO | 2017164810 A1 | 9/2017 |
| WO | 2018048443 A1 | 3/2018 |

OTHER PUBLICATIONS

H. Braunisch et al., "High-Speed Performance of Silicon Bridge Die-to-Die Interconnects," IEEE 20th Conference on Electrical Performance of Electronic Packaging and Systems (EPEPS), Oct. 23-26, 2011, pp. 95-98.
(Continued)

*Primary Examiner* — Peniel M Gumedzoe
(74) *Attorney, Agent, or Firm* — Jeffrey S LaBaw; Ryan, Mason & Lewis, LLP

(57) ABSTRACT

A multi-chip package structure includes a chip interconnect bridge, a fan-out redistribution layer structure, a first integrated circuit chip, and a second integrated circuit chip. The chip interconnect bridge includes contact pads disposed on a top-side of the chip interconnect bridge. The fan-out redistribution layer structure is disposed around sidewalls of the chip interconnect bridge and over the top-side of the chip interconnect bridge. The first and second integrated circuit chips are direct chip attached to an upper surface of the fan-out redistribution layer structure, wherein the fan-out redistribution layer structure includes input/output connections between the contact pads on the top-side of the chip interconnect bridge and the first and second integrated circuit chips.

20 Claims, 10 Drawing Sheets

(52) U.S. Cl.
CPC ...... *H01L 23/5381* (2013.01); *H01L 23/5385* (2013.01); *H01L 25/50* (2013.01); *H01L 2224/16225* (2013.01)

(56) References Cited

U.S. PATENT DOCUMENTS

| | | | |
|---|---|---|---|
| 8,064,224 B2 | 11/2011 | Mahajan et al. | |
| 8,138,015 B2 | 3/2012 | Joseph et al. | |
| 8,227,904 B2 | 7/2012 | Braunisch et al. | |
| 8,866,308 B2 | 10/2014 | Roy et al. | |
| 8,901,748 B2 | 12/2014 | Manusharow et al. | |
| 9,059,179 B2 | 6/2015 | Karikalan et al. | |
| 9,269,701 B2 | 2/2016 | Starkston et al. | |
| 9,275,955 B2 | 3/2016 | Mahajan et al. | |
| 9,368,563 B2 | 6/2016 | Lin et al. | |
| 9,431,347 B2 | 8/2016 | Kunieda et al. | |
| 9,443,824 B1 | 9/2016 | We et al. | |
| 9,640,521 B2 | 5/2017 | Chang et al. | |
| 9,653,428 B1 | 5/2017 | Hiner et al. | |
| 9,704,790 B1 | 7/2017 | Wu et al. | |
| 9,754,890 B2 | 9/2017 | Deshpande et al. | |
| 10,032,707 B2 | 7/2018 | Lai et al. | |
| 10,217,720 B2 | 2/2019 | Wang et al. | |
| 10,262,974 B2 | 4/2019 | Yeh et al. | |
| 2003/0199121 A1 | 10/2003 | Caletka et al. | |
| 2008/0224316 A1 | 9/2008 | Kroeninger et al. | |
| 2011/0312129 A1 | 12/2011 | Joseph et al. | |
| 2012/0261838 A1 | 10/2012 | Braunisch et al. | |
| 2013/0168854 A1 | 7/2013 | Karikalan et al. | |
| 2014/0057411 A1 | 2/2014 | Hoang et al. | |
| 2014/0091474 A1 | 4/2014 | Starkston et al. | |
| 2014/0130969 A1 | 5/2014 | McCutcheon et al. | |
| 2014/0133119 A1* | 5/2014 | Kariya ................. H05K 3/0047 361/767 |
| 2014/0252599 A1 | 9/2014 | Kwon et al. | |
| 2014/0360759 A1 | 12/2014 | Kunieda et al. | |
| 2015/0028486 A1* | 1/2015 | Liu ................... H01L 23/49811 257/773 |
| 2015/0171015 A1 | 6/2015 | Mahajan et al. | |
| 2015/0364422 A1 | 12/2015 | Zhai et al. | |
| 2016/0293572 A1 | 10/2016 | We et al. | |
| 2016/0307870 A1 | 10/2016 | Kelly et al. | |
| 2016/0343666 A1 | 11/2016 | Deshpande et al. | |
| 2016/0372448 A1 | 12/2016 | Yazdani | |
| 2017/0110419 A1 | 4/2017 | Shih et al. | |
| 2017/0271307 A1 | 9/2017 | Hiner et al. | |
| 2018/0040548 A1* | 2/2018 | Kim ................... H01L 25/0657 |
| 2018/0102311 A1 | 4/2018 | Shih | |
| 2018/0158712 A1 | 6/2018 | Ekkels et al. | |
| 2018/0211929 A1* | 7/2018 | Bae ......................... H01L 24/19 |
| 2018/0240778 A1 | 8/2018 | Liu et al. | |
| 2018/0286840 A1 | 10/2018 | Nair et al. | |
| 2018/0314003 A1 | 11/2018 | Coolbaugh et al. | |
| 2019/0109117 A1* | 4/2019 | Fang ................... H01L 21/6835 |

OTHER PUBLICATIONS

R. Mahajan et al., "Embedded Multi-Die Interconnect Bridge (EMIB)—A High Density, High Bandwidth Packaging Interconnect," IEEE 66th Electronic Components and Technology Conference (ECTC), May 31-Jun. 3, 2016, pp. 557-565.

K. Oi et al., "Development of New 2.5D Package with Novel Integrated Organic Interposer Substrate with Ultra-fine Wiring and High Density Bumps," IEEE 64th Electronic Components and Technology Conference (ECTC), May 27-30, 2014, pp. 348-353.

C. Narayan et al., "Thin Film Transfer Process for Low Cost MCM-D Fabrication," Proceedings of the International Conference on Multichip Modules (MCM), Apr. 13-15, 1994, pp. 105-114.

S. Ravichandran et al., "2.5D Glass Panel Embedded (GPE) Packages with Better I/O Density, Performance, Cost and Reliability than Current Silicon Interposers and High-Density Fan-Out Packages," IEEE 68th Electronic Components and Technology Conference (ECTC), May 29-Jun. 1, 2018, pp. 625-630.

U.S. Appl. No. 16/553,453, filed in the name of Joshua Rubin et al. on Aug. 28, 2019 and entitled "Multi-Chip Package Structure Having Chip Interconnection Bridge Which Provides Power Connections Between Chip and Package Substrate."

U.S. Appl. No. 16/043,503, filed in the name of Joshua Rubin et al. on Jul. 24, 2018 and entitled "Multi-Chip Package Structure Having Chip Interconnection Bridge Which Provides Power Connections Between Chip and Package Substrate."

\* cited by examiner

MULTI-CHIP PACKAGE STRUCTURES HAVING EMBEDDED CHIP INTERCONNECT BRIDGES AND FAN-OUT REDISTRIBUTION LAYERS

TECHNICAL FIELD

This disclosure generally relates to semiconductor packaging techniques and, in particular, to multi-chip package structures which implement chip interconnect bridge devices.

BACKGROUND

Innovations in semiconductor fabrication and packaging technologies have enabled the development of smaller scale, higher density integrated circuit (IC) chips (or dies), as well as the development of highly integrated chip modules with wiring and area array input/output (I/O) contact densities that enable dense packaging of IC chips (or dies). For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques can be utilized to construct an MCM package structure. For example, an MCM can be constructed by connecting multiple semiconductor IC dies directly to a package substrate. The semiconductor IC dies can be connected to a surface of the package substrate using wiring bonding, tape bonding, or flip-chip bonding. For high performance and high-density packages, direct chip attachment (DCA) techniques are commonly used for flip-chip bonding IC dies to the package substrate using area arrays of solder interconnects formed between contact pads on active surfaces of the semiconductor IC dies and matching arrays of contact pads formed on a chip mounting surface (or top-side surface) on the package substrate. The package substrate includes wiring for providing die-to-die connections between IC dies mounted to the top-side of the package substrate, as well as wiring for connecting the top-side contacts pads to bottom-side contact pads.

In conventional MCM technologies, the package substrate can be, e.g., a glass-ceramic substrate, or a laminate substrate. For example, a multi-layer ceramic package substrate can be fabricated using low-temperature co-fired ceramic (LTCC) substrate technology. In addition, a laminate package substrate can be fabricated using surface laminate circuit (SLC) technology to produce low-cost organic package substrates with build-up layers that are vertically connected through micro-vias to support solder-bumped flip-chips.

There is a continued demand for IC chips with increasing integrated functionality and smaller footprint sizes, which leads to increases in the I/O count and I/O density of the IC chips. Moreover, high-performance and high-density integrated package solutions typically require small micro-bumps for flip-chip connectivity using interconnect pitches of, e.g., 50 microns or less, and line width and line spacing design rules of 10 microns or less. While an MCM package structure allows heterogeneous IC dies to be directly connected (e.g., DCA) to each other through the package substrate, conventional ceramic-based package substrate and laminate substrate technologies are limited with regard to the smallest achievable contact pad pitch, line width and line spacing. As such, conventional ceramic and organic laminate build up substrates are a bottleneck to high-density packaging, as such substrate technologies cannot support the tight pitches needed for high-density I/O flip-chip connections and high-density die-to-die interconnections.

To address these limitations, 2.5-D packaging techniques are utilized to increase I/O density and provide high-density routing for low power die-to-die communication. In general, 2.5-D integration involves flip-chip bonding multiple IC dies on a passive interposer substrate (e.g., silicon, glass, or fine-pitch organic build substrate), wherein the passive interposer substrate is bonded to the package substrate. As compared to the package substrate, the interposer comprises finer pitch wiring, higher contact pad densities, and shorter distances for die-to-die interconnects.

A silicon interposer for 2.5D packaging consists of a thin layer of silicon which is disposed between the IC dies and the package substrate, and which comprises through-silicon vias (TSVs) to provide a platform with high wiring density for I/O redistribution and die-to-die communication. Silicon interposers require large and expensive silicon chips with TSVs to accommodate multiple chips on the top surface. Unfortunately, silicon interposers are expensive due to the size of the silicon interposer chip needed to accommodate the footprints of multiple dies attached to the surface of the silicon interposer, and due to the use of TSV technology which increases fabrication costs and complexity.

On the other hand, a fine-pitch organic build-up interposer for 2.5D packaging utilizes thin film technology to build fine-pitch organic redistribution layers on top of a conventional organic laminate substrate. While the fine-pitch organic redistribution layers provide a platform with high wiring density for I/O redistribution and die-to-die communication, such technology is limited in the number of fine-pitch redistribution layers and minimum wire pitch that is achievable, as compared to silicon-based interposer solutions.

Other 2.5D packaging solutions utilize silicon bridge devices that are embedded into a package substrate to provide tighter interconnect density between adjacent dies. The silicon bridge devices are lower in cost than conventional silicon interposers as silicon bridge devices are much smaller (they only connect to peripheral regions of adjacent dies) and may or may not utilize costly TSVs. Although silicon bridge devices are simple in form, conventional bridge devices are designed to only include wiring for die-to-die interconnection, but not wiring for, e.g., vertical power distribution through the bridge device from the package substrate to the dies.

However, with increasing IC die functionality and density, there is a need for an increasing number of power and ground pins to minimize ground bounce. As such, IC dies are typically fabricated with power/ground pads dispersed over the area array of I/O contact pads on the back-side of the IC dies. When silicon bridge devices are used for high-density die-to-die I/O interconnections, the bridge devices block vertical power distribution through the bridge structure to power/ground pads that are disposed within the high-density I/O areas of the IC dies which are overlapped by the bridge devices. As such, connections to such power/ground pads must be made from the package substrate to other regions of the IC dies which are not overlapped by the bridge devices, and then routed through the IC dies (as well as through lateral interconnection in the bridge devices) to the power/ ground pads blocked by the bridge devices. This configuration increases the length of the power/ground traces, thus increasing the voltage drop and IR heating within the package substrate.

SUMMARY

Embodiments of the disclosure include multi-chip package structures which comprise embedded chip interconnect bridges and fan-out redistribution layers, as well as methods for fabrication such multi-chip package structures. For example, one embodiment includes a method for constructing a package structure. A chip interconnect bridge is bonded to a carrier substrate, wherein the chip interconnect bridge comprises contact pads disposed on a top-side of the chip interconnect bridge. A fan-out redistribution layer structure is formed which surrounds sidewalls of the chip interconnect bridge and which is disposed over the top-side of the chip interconnect bridge. A first integrated circuit chip and a second integrated circuit chip are direct chip attached to the fan-out redistribution layer structure. The fan-out redistribution layer structure comprises input/output connections between the contact pads on the top-side of the chip interconnect bridge and the first and second integrated circuit chips. The carrier substrate is removed to expose a bottom side of the redistribution layer structure. Solder bumps are formed on the exposed bottom side of the fan-out redistribution layer structure.

Another embodiment includes a method for constructing a package structure. A first stack of redistribution layers is formed on a surface of a carrier substrate. A trench is formed in the first stack of redistribution layers. A chip interconnect bridge is mounted within the trench. A second stack of redistribution layers is formed over the first stack of redistribution layers and a top-side of the chip interconnect bridge. The first and second stacks of redistribution layers form a fan-out redistribution layer structure. A first integrated circuit chip and a second integrated circuit chip are direct chip attached to an upper surface of the second stack of redistribution layers. The second stack of redistribution layers comprises input/output connections between contact pads on the top-side of the chip interconnect bridge and the first and second integrated circuit chips. The carrier substrate is removed to expose a bottom side of the first stack of redistribution layers.

Another embodiment includes a package structure comprising a chip interconnect bridge, a fan-out redistribution layer structure, and a first integrated circuit chip and a second integrated circuit chip. The chip interconnect bridge comprises contact pads disposed on a top-side of the chip interconnect bridge. The fan-out redistribution layer structure is disposed around sidewalls of the chip interconnect bridge and over the top-side of the chip interconnect bridge. The first and second integrated circuit chips are direct chip attached to an upper surface of the fan-out redistribution layer structure, wherein the fan-out redistribution layer structure comprises input/output connections between the contact pads on the top-side of the chip interconnect bridge and the first and second integrated circuit chips.

Other embodiments will be described in the following detailed description of embodiments, which is to be read in conjunction with the accompanying figures.

BRIEF DESCRIPTION OF THE DRAWINGS

FIGS. 1A through 1E schematically illustrate a process for fabricating a multi-chip package structure according to an embodiment of the disclosure, wherein:

FIG. 1A is a schematic cross-sectional side view of a package structure at an intermediate stage of fabrication in which a chip interconnect bridge is attached to an upper surface of a carrier substrate;

FIG. 1B is a schematic cross-sectional side view of the package structure of FIG. 1A after forming a first redistribution layer on the upper surface of the carrier substrate surrounding the chip interconnect bridge;

FIG. 1C is a schematic cross-sectional side view of the package structure of FIG. 1B after forming a second redistribution layer over the first redistribution layer and the chip interconnect bridge;

FIG. 1D is a schematic cross-sectional side view of the package structure of FIG. 1C after attaching a plurality of IC chips to the second redistribution layer; and FIG. 1E is a schematic cross-sectional side view of the package structure of FIG. 1D after removing the carrier substrate and forming an array of solder bump connections on a bottom side of the multi-chip package structure.

FIGS. 2A and 2B schematically illustrate a process for fabricating a multi-chip package structure according to another embodiment of the disclosure, wherein:

FIG. 2A is a schematic cross-sectional side view of a package structure at an intermediate stage of fabrication in which a first redistribution layer and a second redistribution layer are formed over an upper surface of a carrier substrate, and wherein chip interconnect bridge is disposed within a trench formed in the second redistribution layer and bonded to the first redistribution layer; and FIG. 2B is a schematic cross-sectional side view of the package structure of FIG. 2A after forming an upper redistribution layer over the second redistribution layer and the chip interconnect bridge.

FIGS. 3A through 3E schematically illustrate a process for fabricating a multi-chip package structure according to another embodiment of the disclosure, wherein:

FIG. 3A is a schematic cross-sectional side view of a package structure at an intermediate stage of fabrication in which a stack of redistribution layers is formed over an upper surface of a carrier substrate;

FIG. 3B is a schematic cross-sectional side view of the package structure of FIG. 3A after etching a trench in the stack of redistribution layers;

FIG. 3C is a schematic cross-sectional side view of the package structure of FIG. 3B after bonding a chip interconnect bridge within the trench;

FIG. 3D is a schematic cross-sectional side view of the package structure of FIG. 3C after forming additional redistribution layers over the chip interconnect bridge; and FIG. 3E is a schematic cross-sectional side view of the package structure of FIG. 3D after attaching a plurality of IC chips to an uppermost redistribution layer, after removing the carrier substrate to expose a bottommost redistribution layer, and forming solder bumps on contact metallization of the bottom most redistribution layer.

FIGS. 4A and 4B schematically illustrate a process for fabricating a multi-chip package structure according to another embodiment of the disclosure, wherein FIG. 4A is a schematic cross-sectional side view of a package structure at an intermediate stage of fabrication in which a chip interconnect bridge comprising a pre-applied layer of underfill material and solder bumps is mounted within a trench that is etched in stack of redistribution layers; and FIG. 4B is a schematic cross-sectional side view of the package structure of FIG. 4A after forming additional redistribution layers over the chip interconnect bridge, attaching a plurality of IC chips to an uppermost redistribution layer, after removing the carrier substrate to expose a bottommost redistribution layer, and forming solder bumps on contact metallization of the bottommost redistribution layer.

FIGS. 5A and 5B schematically illustrate a process for fabricating a multi-chip package structure according to another embodiment of the disclosure, wherein:

FIG. 5A is a schematic cross-sectional side view of a package structure at an intermediate stage of fabrication after forming a stack of redistribution layers over an upper surface of a carrier substrate, after etching a trench through the redistribution layers down to the upper surface of carrier substrate, and after bonding a chip interconnect bridge to an exposed surface of the carrier substrate within the trench; and FIG. 5B is a schematic cross-sectional side view of the package structure of FIG. 5A after forming additional redistribution layers over the top-side of the chip interconnect bridge, attaching a plurality of IC chips to an uppermost redistribution layer, after removing the carrier substrate, and forming additional redistribution layers on the backside the chip interconnect bridge.

FIGS. 6A and 6B schematically illustrate a process for fabricating a multi-chip package structure according to another embodiment of the disclosure, wherein:

FIG. 6A is a schematic cross-sectional side view of a package structure at an intermediate stage of fabrication wherein a chip interconnect bridge is bonded to an etch stop layer formed on a surface of a carrier substrate, wherein the chip interconnect bridge is surrounded by a vertical interconnect layer, and wherein a plurality of IC chips are flip-chip mounted to upper surfaces of the chip interconnect bridge and the vertical interconnect layer; and FIG. 6B is a schematic cross-sectional side view of the package structure of FIG. 6A after removing the carrier substrate, performing a backside polis process to expose a bottom surface of the chip interconnect bridge, and forming a fan-out redistribution layer structure which is connected to bottom surfaces of the chip interconnect bridge and the vertical interconnect layer.

DETAILED DESCRIPTION

Figure 1A:
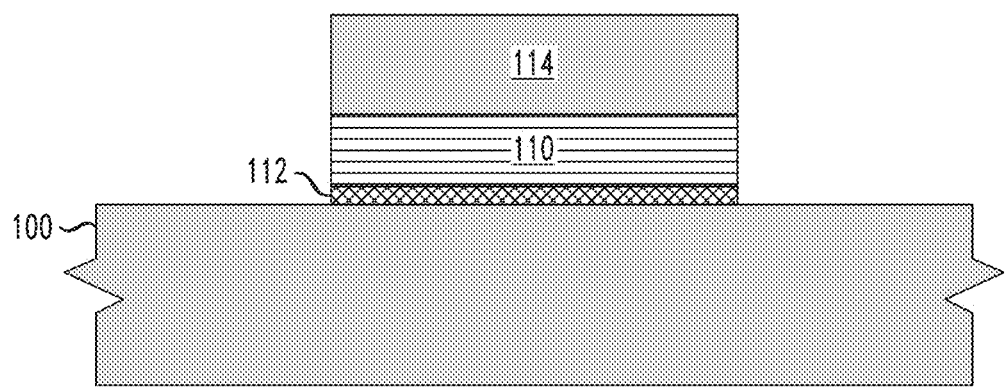

Embodiments of the disclosure will now be discussed in further detail with regard to multi-chip package structures which comprise chip interconnect bridge devices that are designed to provide high I/O interconnect density and high bandwidth signal distributions between adjacent chips in the package structure, as well as provide vertical power distribution traces through the chip interconnect bridge device to supply power (and ground) connections from a package substrate to the chips connected to the to chip interconnect bridge device. More specifically, in some embodiments, a multi-chip package structure is constructed with a chip interconnect bridge device embedded within a wafer-level or a panel-level fan-out redistribution layer (RDL), and multiple semiconductor integrated circuit dies (referred to herein as IC chips) connected to the chip interconnect bridge device and a front-side of the fan-out RDL. In some embodiments, a multi-chip package structure is constructed with a chip interconnect bridge device embedded within a dielectric trench, or in one or more laminated dielectric layers (as opposed to a mold), and a wafer-level or panel-level fan-out RDL formed on top of the chip interconnect bridge, and multiple IC chips connected to the front-side of the fan-out RDL. In particular, this disclosure teaches novel structures/ methods for routing power between chips and bridges using wafer/panel level RDLs, or routing power through a bridge from the backside. The bridge is embedded during the RDL fabrication process.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

FIGS. 1A through 1E schematically illustrate a process for fabricating a multi-chip package structure according to an embodiment of the disclosure. To begin, FIG. 1A is a schematic cross-sectional side view of a package structure at an intermediate stage of fabrication in which a chip interconnect bridge 110 is attached to an upper surface of a carrier substrate 100 using a die attach film 112. In the exemplary embodiment shown, a bridge handler 114 is bonded to a top-side of the chip interconnect bridge 110. In some embodiments, the carrier substrate 100 comprises a semiconductor substrate (e.g., semiconductor wafer) or a glass substrate (e.g., glass wafer). The die attach film 112 may comprise any type of adhesive material (e.g., non-conductive epoxy) which is suitable for the given application. The bridge handler 114 is an optional element that can be used to provide structural support to the chip interconnect bridge 110 for manipulating and bonding the chip interconnect bridge 110 to the carrier substrate 100. The bridge handler 114 is removed after the bonding the chip interconnect bridge 110 to the carrier substrate 100.

The chip interconnect bridge 110 comprises fine-pitch wiring to provide high-density, high bandwidth I/O connectivity between two or more IC chips of the multi-chip package structure. The chip interconnect bridge 110 can be constructed using various types of materials and semiconductor fabrication techniques to obtain target line-width and line-spacing design rules that are suitable for the given application. In some embodiments, the fine-pitch wiring of the interconnect bridge device 110 can be formed with sub-micron line-width and line-spacing design rules using bridge fabrication techniques such as disclosed in commonly owned U.S. patent application Ser. No. 16/043,503, filed on Jul. 24, 2018, entitled "Multi-Chip Package Structure Having Chip Interconnection Bridge Which Provides Power Connections Between Chip and Package Substrate," the disclosure of which is fully incorporated herein by reference.

In general, U.S. patent application Ser. No. 16/043,503 describes methods for fabricating interconnect bridges on a temporary carrier substrate using wafer level fan out techniques in conjunction with back-end-of-line (BEOL) fabrication methods in which typical BEOL dielectric and metallic materials are utilized to form a chip interconnect bridge structure comprising multiple layers of wiring and inter-layer vias which provide high density die-to-die interconnect wiring for high-bandwidth I/O communication between multiple IC chips, and possible redistribution layers to route power/ground connections through the chip interconnect bridge structure from bottom-side flip-chip connections with the package substrate to top-side flip-chip connections with the IC chips. For example, in some embodiments, the chip interconnect bridge 110 can be fabricated by a process which comprises building a BEOL structure on a first carrier wafer, wherein the BEOL structure comprises a stack of signal interconnect and redistribution layers comprising fine pitch signal wires and vertical inter-level vias (e.g., copper wiring and vias) that are formed in multiple inter-level dielectric (ILD) layers of dielectric material (e.g., silicon based low-k dielectrics (e.g., k less than about 4.0), porous dielectrics, or other suitable ULK (ultra-low-k) dielectric materials (with k less than about 2.5)). A second carrier wafer (e.g., handler wafer) is then bonded to a top-side of the BEOL structure, and the first carrier wafer is removed by, e.g., mechanical grinding and polishing. An adhesive or laminated film (which serves as the DAF 112) is then formed on the polished bottom-side of the BEOL structure, and the wafer-level structure is then diced to obtain the individual chip interconnect bridge structure 110, with the DAF 112 on the bottom side of the bridge structure 110 and the bridge handler 114 on the top side of the chip interconnect bridge structure 110.

The bridge handler 114 is removed after the bonding the chip interconnect bridge 110 to the carrier substrate 100 using known techniques. For example, when the bridge handler 114 is bonded to the chip interconnect bridge 110 using a releasable adhesive layer, the bridge handler 114 can be removed by ablating or vaporizing the adhesive layer using, e.g., IR laser ablation, to release the bridge handler 114. In other embodiments, when the bridge handler 114 can be removed using other suitable mechanical debonding techniques.

Figure 1B:
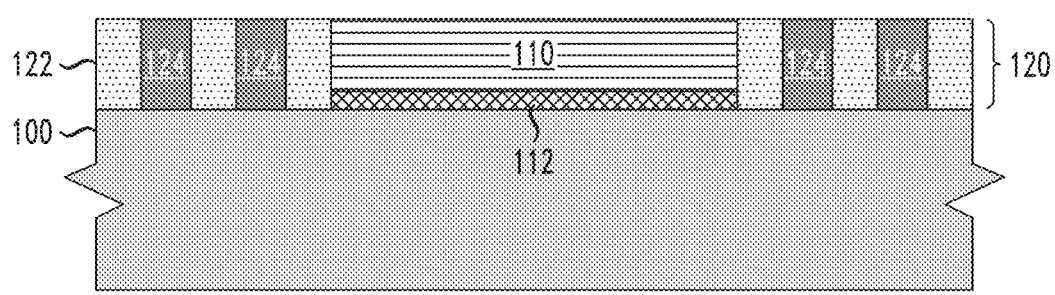

Next, FIG. 1B is a schematic cross-sectional side view of the package structure of FIG. 1A after forming a first redistribution layer 120 on the upper surface of the carrier substrate 100 surrounding the chip interconnect bridge 110. The first redistribution layer 120 comprises a first insulating layer 122 and vertical interconnects 124 (e.g., conductive vias) formed in the first insulating layer 122. In some embodiments, the first insulating layer 122 comprises a pre-patterned laminate film (e.g., organic film) which is bonded to the surface of the carrier substrate 100 and which has an opening that corresponds to the footprint of the chip interconnect bridge 110. In other embodiments, the first insulating layer 122 can be formed by depositing and planarizing a layer of dielectric material (e.g., organic polymer material). In other embodiments, the first insulating layer 122 comprises a mold compound that is formed to encapsulate the chip interconnect bridge 110, and then planarized using, e.g., a chemical-mechanical polishing (CMP)) down to a level of the upper surface of the chip interconnect bridge 110. In some embodiments, a protective film is formed on the upper surface of the interconnect bridge 110 to protect the surface from damage from the planarizing process.

Further, the conductive vias 124 are formed of a low resistance metallic material such as copper. The conductive vias 124 can be formed by patterning an array of via openings in the first insulating layer 122 using a suitable patterning process such as laser drilling, reactive ion etching (ME), etc. The via openings are then filled by depositing a layer of metallic material (e.g., copper), and the layer of metallic material is planarized using, e.g., a chemical-mechanical polishing (CMP)) to remove the overburden metallic material and planarize the layer of metallic material down to the surface of the first insulating layer 122 and, thereby, form the conductive vias 124. Again, in some embodiments, a protective film is formed on the upper surface of the interconnect bridge 110 if plating and CMP processes are used to form the vias 124. For example, in some embodiments, the protective film is pre-deposited on the upper surface of the interconnect bridge 110 before joining the interconnect bridge to the 110 to the carrier substrate 100. In other embodiments, the protective film can be deposited over the first insulating layer 122 and patterned for us as an etch mask to etching via openings in the first insulating layer 122 for the vias 124. In some embodiments, the protective film (e.g., etch mask) is removed before additional RDL layers are formed on the first redistribution layer 130.

Figure 1C:
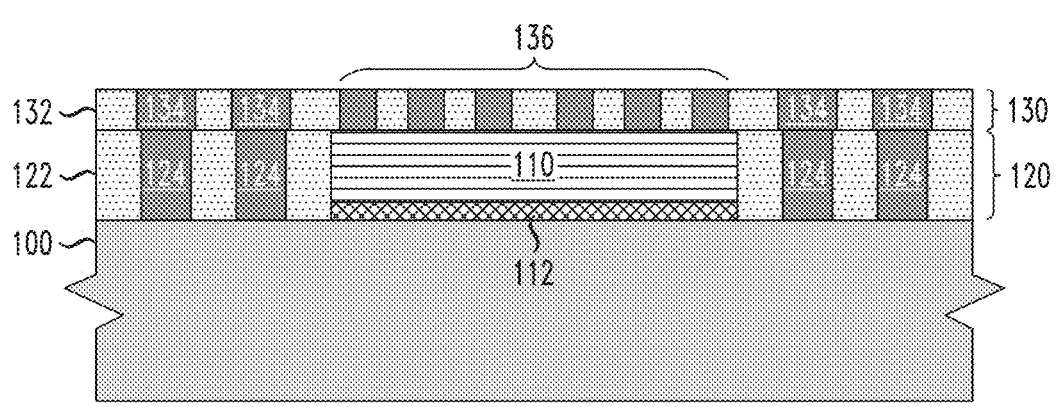

Next, FIG. 1C is a schematic cross-sectional side view of the package structure of FIG. 1B after forming a second redistribution layer 130 over the first redistribution layer 120 and the chip interconnect bridge 110. The second redistribution layer 130 comprises a second insulating layer 132, and metallization 134 and 136. The metallization 134 comprises horizontal wiring and vertical contacts (e.g., contact pads), and the metallization 136 comprises an area array of vertical contacts which are formed in alignment with an area array of contact pads that are exposed on the upper surface of the chip interconnect bridge 110. Although not specifically shown in FIG. 1C, the metallization 34 may include wiring that lateral extends within/above the footprint region of the interconnect bridge 110 to, e.g., enable lateral power distribution above the interconnect bridge 110. In some embodiments, the area array of vertical contacts 136 are formed with a contact pitch of about 55 microns or less, depending on the application. In some embodiments, the contact pitch of the area array of vertical contacts 136 can have sub-arrays of vertical contacts with different pitches, depending on the application. In addition, the pitch of various features of the metallization 134 can vary within or outside of the footprint region of the interconnect bridge 110.

The second insulating layer 132 may comprise an organic laminate layer that is formed using standard organic laminate build-up layers in which the insulating layer are formed of an organic material (e.g. polyimide, FR4, etc.). The use of organic build-up layers facilitates the fabrication of thick wiring and interconnects for purposes of power distribution through the RDL layers 120 and 130 of the package structure. In other embodiments, the second RDL layer 130 can be fabricated using fine-pitch organic redistribution layers to provide greater wiring density for I/O redistribution as needed. In other embodiments, the RDL layers 120 and 130 can be fabricated using standard BEOL fabrication methods, with more relaxed design rules than the BEOL processes that are used, for example, to fabricate the chip interconnect bridge 110. While the exemplary embodiment of FIG. 1C illustrates a fan-out RDL structure comprising two redistribution layers 120 and 130 with the second redistribution layer 130 being the upper most redistribution layer, in other embodiments, the fan-out RDL structure of a multi-chip package structure can include more than two redistribution layers, depending on the given application.

Figure 1D:
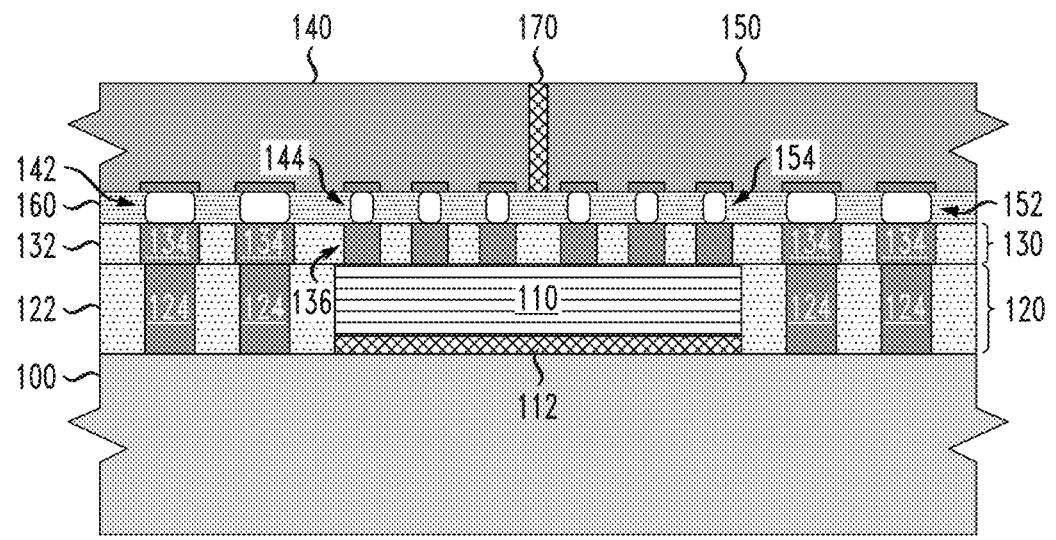

Next, FIG. 1D is a schematic cross-sectional side view of the package structure of FIG. 1C after attaching a plurality of IC chips to the second (uppermost) redistribution layer 130. In particular, FIG. 1D illustrates a first IC chip 140 and a second IC chip 150 which are flip-chip bonded to the second redistribution layer 130. The first IC chip 140 comprises a first array of solder bumps 142 and a second array of solder bumps 144 which are disposed on the active surface of the first IC chip 140. The second IC chip 150 comprises a first array of solder bumps 152 and a second array of solder bumps 154 which are disposed on an active surface of the second IC chip 150. The first arrays of solder bumps 142 and 152 of the IC chips 140 and 150 are bonded to target locations of the metallization 134 of the upper redistribution layer 130. The second arrays of solder bumps 144 and 154 of the first and second IC chips 140 and 150 are bonded to corresponding vertical contacts of the area array of vertical contacts 136 of the upper redistribution layer 130. The IC chips 140 and 150 comprise respective fine-pitch area arrays of flip-chip bumps 144 and 154, which are bonded to the fine-pitch flip-chip bumps 136 on the top-side of the interconnect bridge 110. The first and second IC chips 140 and 150 can be flip-chip bonded to the upper redistribution layer 130 using solder reflow or thermo-compression bonding techniques.

In some embodiments, the area arrays of flip-chip bump connections 144 and 154 comprise micro-bumps for high density I/O signal communication between the adjacent IC chips 140 and 150, wherein the flip-chip micro-bump connections 144 and 154 are formed with a contact pitch of about 55 microns or less, depending on the application. Further, the arrays of flip-chip bump connections 142 and 152 comprise signal I/O and power (e.g., low voltage and ground) connections between the redistribution layers and the IC chips 140 and 150. In some embodiments, the arrays of flip-chip bump connections 142 and 152 have a coarser pitch than the arrays of flip-chip bump connections 144 and 154. In other embodiments, the arrays of flip-chip bump connections 142 and 152 comprise fine-pitch micro-bump connections. In some embodiments, the arrays of flip-chip bump connections 142 and 152 are formed with a contact pitch of about 75 microns or greater, depending on the application. The area array of solder ball interconnects 194 (e.g. BGA) on the bottom side of the package substrate 110 are formed with a contact pitch of about 300 microns or greater, depending on the application.

An underfill material 160 is disposed between the upper redistribution layer 130 and the IC chips 140 and 150. The underfill material 160 comprises an electrically-insulating adhesive material which is utilized to maintain the structural integrity of the flip-chip connections between the upper redistribution layer 130 and the IC chips 140 and 150. In some embodiments, the underfill layer 160 is formed following flip-chip bonding of the first and second IC chips 140 and 150 using a capillary underfill to deposit a liquified underfill material between the IC chips 140 and 150 and the upper redistribution layer 130, followed by a cure process to harden the underfill material. In some embodiments, the underfill layer 160 may comprise pre-applied under fill layers that are applied on the upper surface of the redistribution layer 130 or on the bumped surfaces of the IC chips 140 and 150 prior to the flip-chip bonding process. Following formation of the underfill material 160, a molding process is performed to encapsulate the first and second IC chips 140 and 150 and the exposed portions of the underlaying redistribution layers 120 and 130 in a molding layer 170.

For a heterogeneous packaging application, the IC chips 140 and 150 may comprise any type integrated circuits and systems to implement a given application. In addition, a multi-chip package can be fabricated with two or more chip interconnect bridge structures and more than two IC chips. The IC chips 140 and 150 can include, e.g., a high-bandwidth memory (HBM) dynamic random-access memory (DRAM) device, a hardware accelerator device, a multi-core processor device, a memory device, central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

While the flip-chip bump connections 142, 144, 152, and 154 are generically illustrated in FIG. 1D for ease of illustration, it is to be understood that the flip-chip bump connections 142, 144, 152, and 154 can be implemented using any suitable flip-chip bump technology. For example, the flip-chip bump connections 142, 144, 152, and 154 can be implemented using controlled collapse chip connection (C4) flip-chip bump technology where solder balls are formed on ball limiting metallurgy (BLM) pads or under bump metallization (UBM) pads. The solder balls can be formed by solder paste printing or electroplating. In other embodiments, the flip-chip bump connections 142, 144, 152, and 154 can be chip connection (C2) bumps comprising metallic pillar structures (e.g. copper pillars) that are formed on metal pads. The metallic pillar bump structures may or may not have solder endcaps. In other embodiments, the flip-chip bump connections 142, 144, 152, and 154 can be C2 bumps with plated metal formed on UBM pads.

In other embodiments, solder micro bumps comprising Cu and Sn can be electroplated on UBM pads, wherein the UBM pads comprise electroless plated nickel and immersion gold. The joining of the two flip-chip elements can be performed by joining CuSn solder micro bumps on one flip-chip element to UBM pads on another flip-chip element, or by joining CuSn solder micro bumps on one flip-chip element to CuSn solder micro bumps on another flip-chip element. In other embodiments, an area array of copper pillar bumps on one flip-chip element can be bonded to an area array of solder balls on another flip-chip element. In addition, an area array of high-temperature solder bumps formed on UBM pads on one flip-chip element can be joined to an area array of low temperature solder bumps formed on contact pads of another flip-chip element.

As further shown in FIG. 1D, in some embodiments, a footprint of the IC chips 140 and 150 partially overlap the chip interconnect bridge 110. In other embodiments of package structures, there can be a small IC die (relative to a large IC die such as an accelerator (e.g., GPU)) which has a chip interconnect bridge that fully supports the footprint of the smaller IC die, while only partially overlapping the larger IC die. In this instance, the bridge device can be irregularly shaped (e.g., non-rectangular) in order to accommodate both the smaller and larger IC dies that are attached to the bridge. There are various advantages to forming bridge devices which fully support small IC dies. For example, with a small IC die such as an HBM DRAM, the spacing between various regions of the bump footprint may be very small (e.g., spacing between power region and signal I/O region can be 75 microns or less). This tight spacing between bump regions makes it very difficult to mount the small IC die to the bridge device using only a portion of the bump footprint of the small IC die while still accommodating bumps with the package laminate substrate outside of the region of the bridge device. In this instance, it may not be possible to join some bumps near the edge of the bridge device. Additionally, with an IC die that has all micro-bumps, it may be difficult to flip-chip mount the IC die to both the bridge device and the package laminate substrate with micro-bumps, since they are both at fine pitch. Therefore, in this instance, it would easier to flip-chip mount the entire IC die to the bridge device.

Figure 1E:
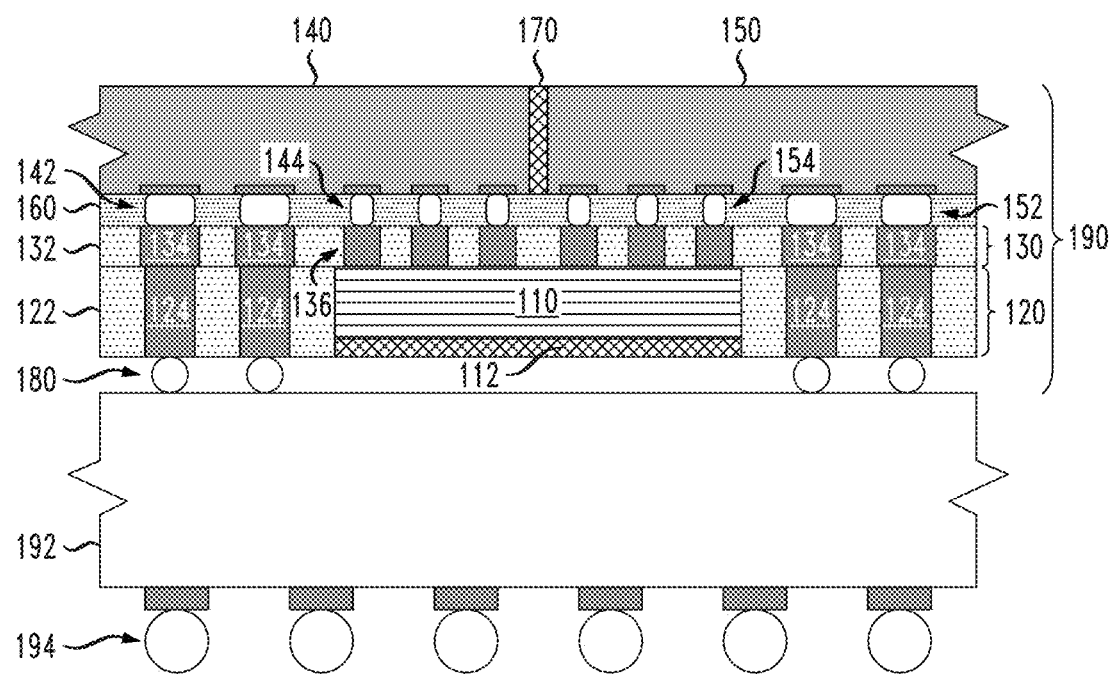

Next, FIG. 1E is a schematic cross-sectional side view of the package structure of FIG. 1D after removing the carrier substrate 100 and forming an array of solder bump connections 180 on the bottom side of the fan-out RDL structure to complete the formation of a multi-chip package structure 190 comprising the chip interconnect bridge 110 embedded in a fan-out RDL structure. The array of solder bump connections 180 can be C4 solder bumps formed on UBM or BLM pads and have a contact pitch which is the same or coarser than the contact pitch of the solder bump connections 142 and 152 on the top-side of the fan-out RDL structure.

FIG. 1E further illustrates an optional process of bonding the multi-chip package structure 190 to an upper surface of a package substrate 192. The package substrate 192 may comprise a ceramic substrate, a silicon substrate or an organic laminate build-up substrate, or any other type of package substrate technology that is suitable for the given application. The package substrate 192 comprises an area array of solder bump interconnects 194 (e.g., Ball Grid Array (BGA) solder interconnects) formed on a bottom side of the package substrate 192. The package substrate 192 comprises a network of package traces which vertically and horizontally extend through the package substrate 192 to form connections between the solder bump interconnects 180 on the top-side of the package substrate 192 to the solder bump interconnections 194 on the bottom side of the package substrate 192.

Figure 2A:
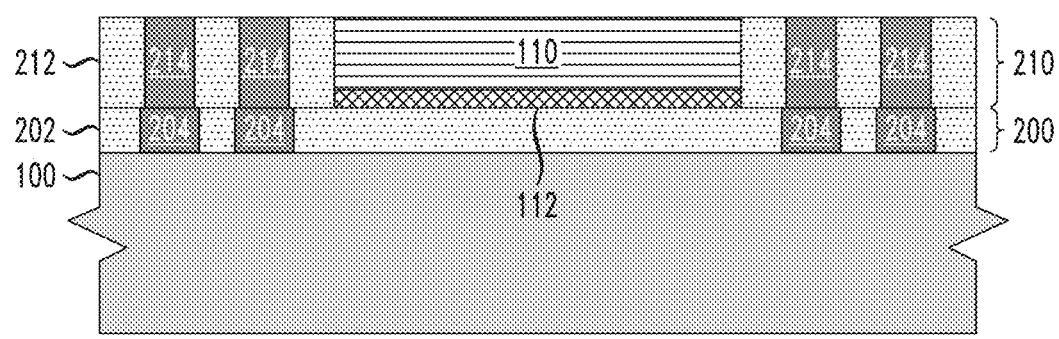
Figure 2B:
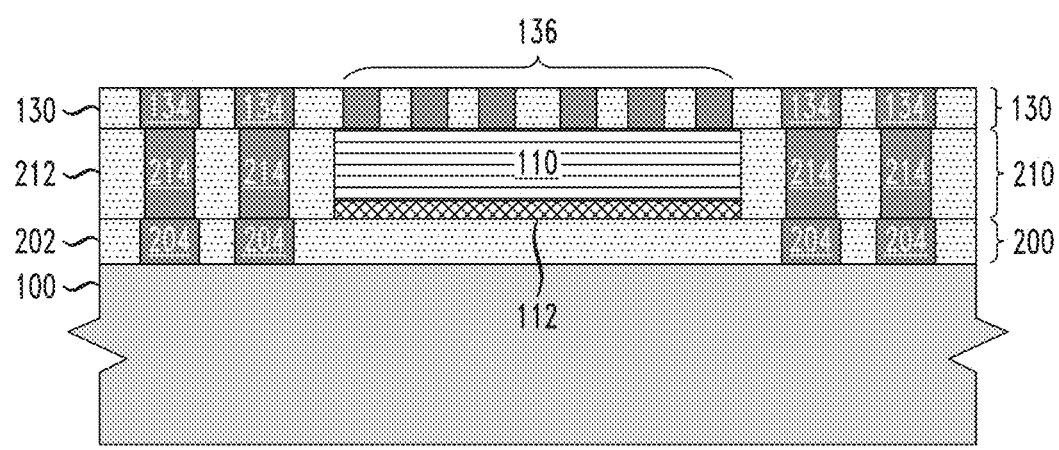

FIGS. 2A and 2B schematically illustrate a process for fabricating a multi-chip package structure according to another embodiment of the disclosure. In general, FIGS. 2A and 2B illustrate an alternative process module in the fabrication process of FIGS. 1A through 1E, wherein an initial layer of the fan-out RDL is formed with metallic pillar structures as opposed to the conductive vias 124. More specifically, FIG. 2A is a schematic cross-sectional side view of a package structure at an intermediate stage of fabrication in which a first redistribution layer 200 and a second redistribution layer 210 are formed over an upper surface of a carrier substrate 100, and wherein the chip interconnect bridge 110 is disposed within the second redistribution layer 210 and bonded to the first redistribution layer 200 using the die attach film 112. The first redistribution layer 200 comprises an insulating layer 202 and metallic contact pads 204 disposed within the insulating layer 202. The second redistribution layer 210 comprises an insulating layer 212 and metallic pillars 214 which are disposed within the insulating layer 212 and in contact with the contact pads 204. In some embodiments, the intermediate structure shown in FIG. 2A is fabricated as follows.

The first redistribution layer 210 is initially fabricated by forming the insulating layer 202 over the surface of the carrier substrate 100. In some embodiments, one or more layers of an adhesive film or etch stop layer can be formed on the surface of the carrier substrate 100 prior to forming the first redistribution layer 210. The insulating layer 202 is formed of an organic laminate film or any suitable dielectric or polymer material. The insulating layer 202 is patterned to form openings that are filled with metallic material (e.g., copper) to form the contact pads 204. After forming the first redistribution layer 200, a layer of photoresist material is formed over the first redistribution layer 210. The layer of photoresist material is developed and patterned to form a photomask with openings that expose portions of the underlying contact pads 204. The openings of the photomask are filled with a metallic material such as copper to form the metallic pillars 214. The metallic pillars 214 can be formed using any suitable metal deposition process such as electroplating. The photomask is then stripped away using known etch solutions to expose the metallic pillars 214 and the first redistribution layer 200.

After removing the photomask, the chip interconnection bridge 110 is bonded to the first redistribution layer 202 using techniques as discussed above. As shown in FIG. 2A, in some embodiments, the chip interconnection bridge 110 is bonded to a region of the insulating layer 202 which is devoid of contact pads 204. A layer of dielectric material is then deposited and planarized to form the insulating layer 212 of the second redistribution layer 210, which encapsulates the metallic pillar structures 214 and surrounds the chip interconnection bridge 110. The insulating layer 212 may comprise an organic film or any suitable dielectric or polymer material. In some embodiments, the insulating layer 212 comprises an epoxy resin which is formed using a standard chip molding process.

Next, FIG. 2B is a schematic cross-sectional side view of the package structure of FIG. 2A after forming an upper redistribution layer 130 over the second redistribution layer 210 and the chip interconnect bridge 110. In particular, in some embodiments, the upper redistribution layer 130 in FIG. 2B is formed using the same process and materials as the second redistribution layer 130 discussed above in conjunction with FIG. 1C, the details of which will not be repeated. Following formation of the upper redistribution layer 130 in FIG. 2B, the process flow continues with the process steps discussed above in conjunction with FIGS. 1D and 1E to complete formation of a multi-chip package structure comprising the chip interconnect bridge 110 embedded in a fan-out RDL structure comprising the redistribution layers 200, 210 and 130.

Figure 3A:
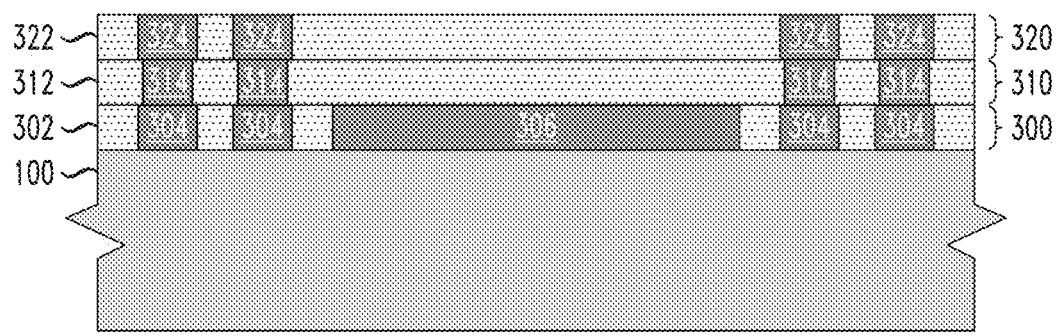

FIGS. 3A through 3E schematically illustrate a process for fabricating a multi-chip package structure according to another embodiment of the disclosure. To begin, FIG. 3A is a schematic cross-sectional side view of a package structure at an intermediate stage of fabrication in which a stack of redistribution layers is formed over an upper surface of a carrier substrate 100. The stack of redistribution layers comprises a first redistribution layer 300, a second redistribution layer 310, and a third redistribution layer 320. The first redistribution layer 300 comprises an insulating layer 302 and metallization 304 and an etch stop pad 306 formed in the insulating layer 312. The second redistribution layer 310 comprises an insulating layer 312 and metallization 314 formed in the insulating layer 312. The third redistribution layer 320 comprises an insulating layer 322 and metallization 324 formed in the insulating layer 322. The redistribution layers 300, 310, and 320 are formed of the same insulating and metallic materials as discussed above. In some embodiments, the etch stop pad 306 is formed of the same metallic material that is used to form the metallization 304 of the first redistribution layer 300. In other embodiments, the etch stop pad 306 can be formed of a dielectric material that has etch selectivity with respect to the dielectric materials used to for the insulating layers 302, 312, and 322.

Figure 3B:
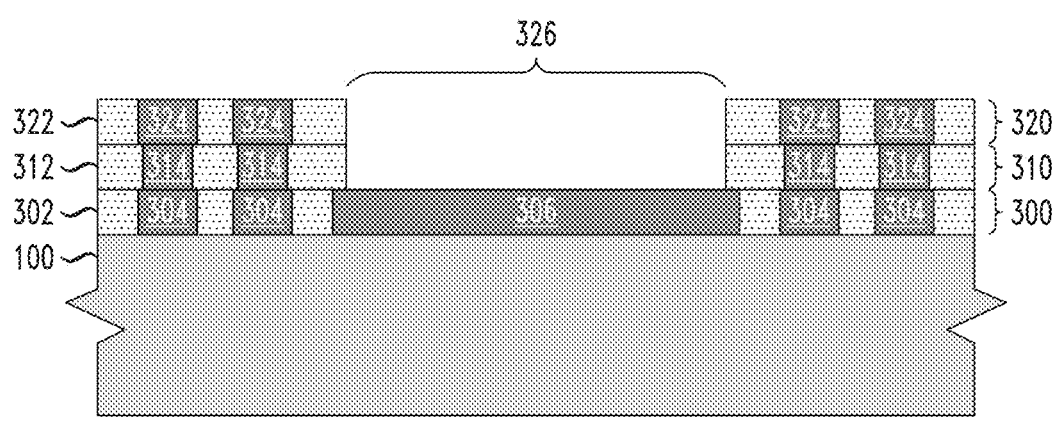

Next, FIG. 3B is a schematic cross-sectional side view of the package structure of FIG. 3A after etching a trench 326 through the insulating layers 322 and 312 of the redistribution layers 320 and 310 down to an upper surface of the first redistribution layer 300. The trench 326 is formed in a footprint region of the second and third redistribution layers 310 and 320 in which the respective insulating layers 312 and 322 are devoid of metallization 314 and 324. The trench 326 may be etched using standard photolithographic patterning techniques in which a photoresist mask is formed over the third redistribution layer 320, wherein the photoresist mask comprises an opening that defines a footprint image of the trench 326. The etch process can be implemented using a dry etch process with an etch chemistry which is configured to etch the materials of the insulating layers 312 and 322 selective to the material of the etch stop pad 306. In this instance, the etch stop pad 306 serves as an etch termination mechanism.

Figure 3C:
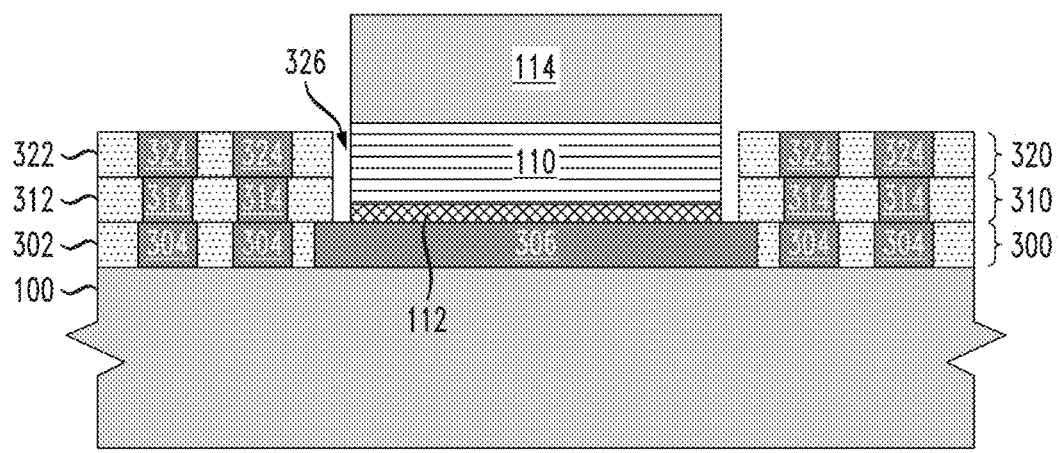

Next, FIG. 3C is a schematic cross-sectional side view of the package structure of FIG. 3B after bonding a chip interconnect bridge 110 to an exposed region of the first redistribution layer 300 within the trench 326. In particular, as shown in FIG. 3C, the bridge handler 114 is utilized to place the chip interconnect bridge 110 into the trench 326 and the die attached film 112 is used to bond the chip interconnect bridge 110 to exposed surface of the first redistribution layer 300. In some embodiments, the footprint of the trench 326 is formed to be slightly larger than the footprint of the chip interconnect bridge 110 to allow the chip interconnect bridge 110 to be readily placed within the trench 326. The bridge handler 114 is removed after the bonding the chip interconnect bridge 110 to the first redistribution layer 300.

Figure 3D:
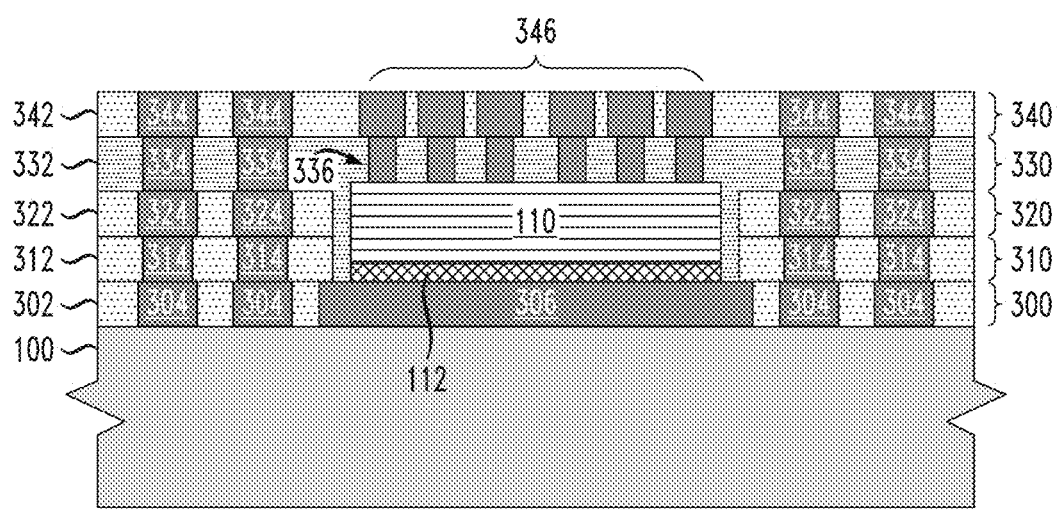

Next, FIG. 3D is a schematic cross-sectional side view of the package structure of FIG. 3C after forming additional redistribution layers 330 and 340 over the chip interconnect bridge 110. The additional redistribution layers comprise a fourth redistribution layer 330 and a fifth redistribution layer 340. The fourth redistribution layer 330 comprises an insulating layer 332 and metallization 334 and 336 formed in the insulating layer 332. The fifth redistribution layer 340 comprises an insulating layer 342 and metallization 344 and 346 formed in the insulating layer 342.

Following removal of the bridge handler 114, the insulating layer 332 of the fourth redistribution layer 330 is formed by depositing a layer of dielectric material to fill in the spaces between the vertical sidewalls of the chip interconnect bridge 110 and the trench 326 and to cover the upper surfaces of the chip interconnect bridge 110 and third redistribution layer 320. The layer of dielectric material is then planarized (e.g., via CMP) to create a planar surface on which the fifth redistribution layer 340 can be formed. In some embodiments, the insulating layer 332 may be formed using multiple deposition methods, wherein a first deposition process is performed to adequately fill the small spaces between the chip interconnect bridge 110 and the sidewalls of the trench 326, followed by a second deposition and planarization process to form the planarized insulating layer 332.

The insulating layer 332 of the fourth redistribution layer 330 can be a spin-on dielectric material, a molding material (e.g., epoxy resin), or any other suitable type of laminated dielectric material. In other embodiments, the insulating layer 332 can be formed of a self-planarizing dielectric material which does not require physical or CMP polishing after deposition.

The metallization 334 and 336 is formed using methods as discussed above. The metallization 334 comprises horizontal wiring and vertical contacts (e.g., contact pads), and the metallization 336 comprises an area array of vertical contacts which are formed in alignment with an area array of contact pads that are exposed on the upper surface of the chip interconnect bridge 110. In some embodiments, the area array of vertical contacts 336 are formed with a contact pitch of about 55 microns or less, depending on the application. Similar to methods and materials as discussed above, the fifth redistribution layer 340 is formed by depositing a layer of insulating material to form the insulating layer 342, patterning the insulating layer 342 to form openings, and filling the openings with metallic material to form the metallization 344 and 346. In this embodiment, the metallization 346 is formed is contact with the area array of vertical contacts 336 to enable additional redistribution of the I/O connections between the chip interconnect bridge 110 and the IC chips to be mounted to the fifth redistribution layer 340.

Figure 3E:
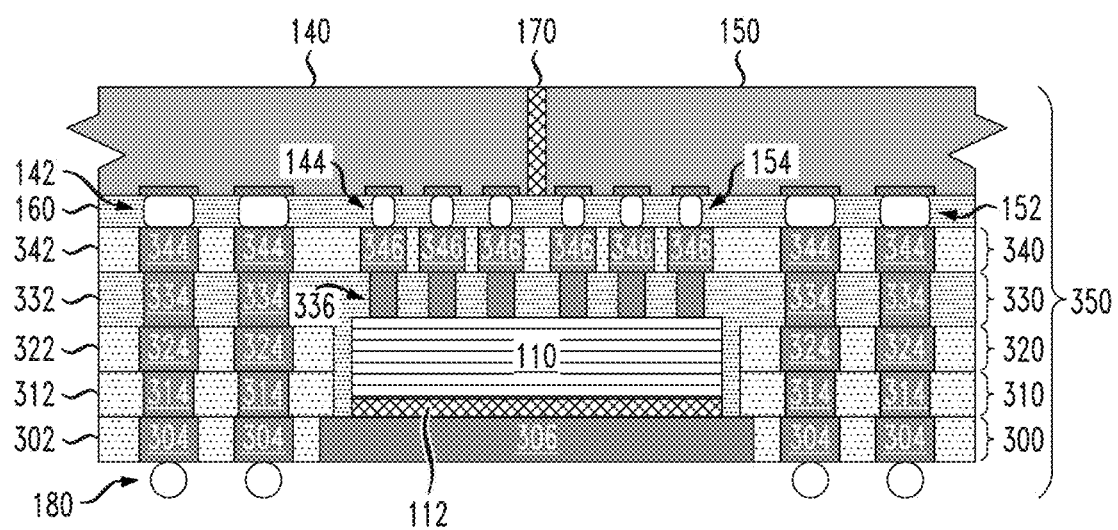

Next, FIG. 3E is a schematic cross-sectional side view of the package structure of FIG. 3D after attaching a plurality of IC chips 140 and 150 to the fifth (uppermost) redistribution layer 340, after removing the carrier substrate 100 to expose the first (bottommost) redistribution layer 300, and forming solder bumps 180 on the contact metallization 304 of the first redistribution layer. In some embodiments, the structure in FIG. 3E is formed using the same process and materials as discussed above in conjunction with FIGS. 1D and 1E, the details of which will not be repeated. FIG. 3E illustrates a multi-chip package structure 350 comprising the chip interconnect bridge 110 embedded in a fan-out RDL structure comprising the redistribution 300, 310, 320, 330, and 340.

Figure 4A:
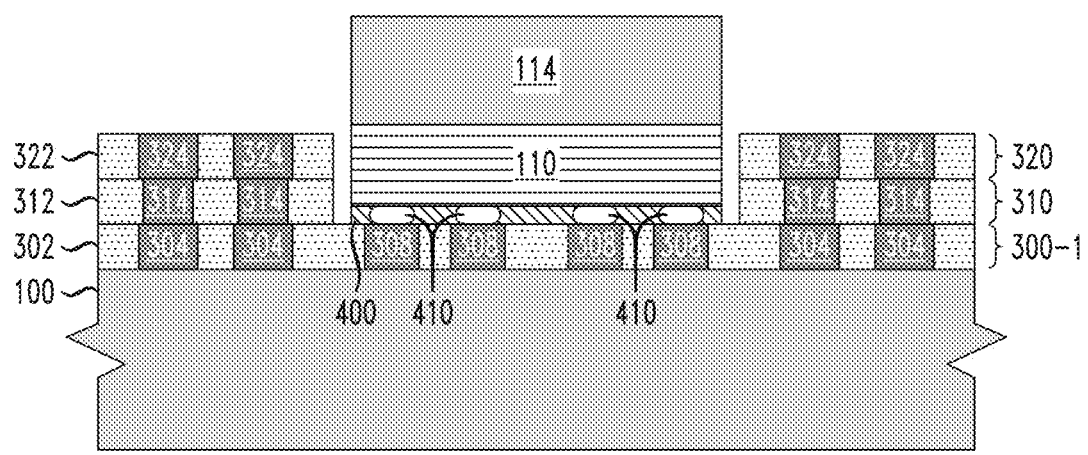
Figure 4B:
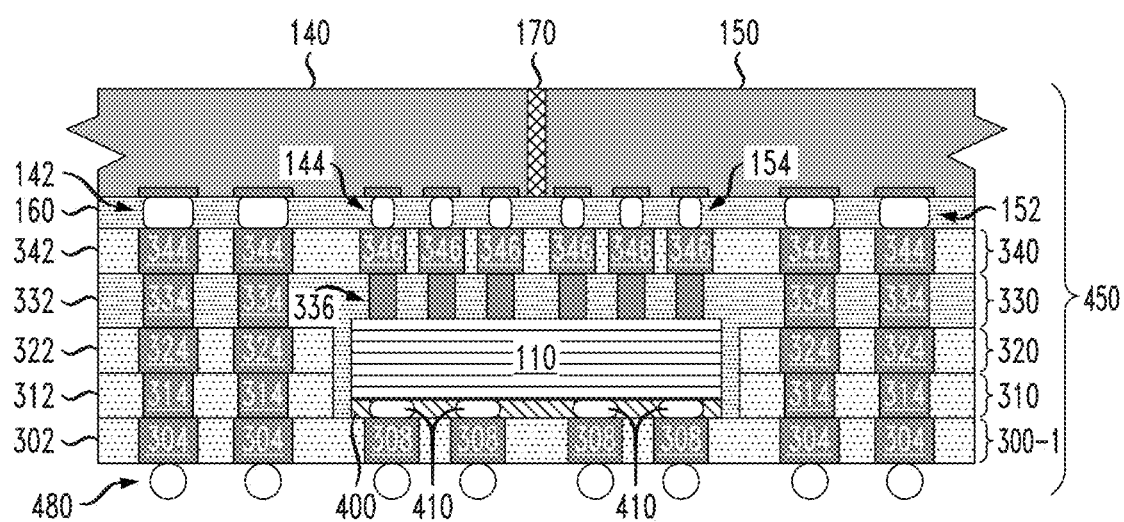

FIGS. 4A and 4B schematically illustrate a process for fabricating a multi-chip package structure according to another embodiment of the disclosure. In general, FIGS. 4A and 4B illustrate an alternative process module in the fabrication process of FIGS. 3A through 3E, wherein an initial redistribution layer 300-1 of the fan-out RDL is formed with metallic contact 308 (as opposed to the etch stop pad 306 in FIG. 3A) to enable back-side connections to the chip interconnect bridge 110. In other embodiments one or more of an adhesive layer and/or etch stop layer may be formed on the carrier substrate 100 prior to forming the initial redistribution layer 300-1. More specifically, FIG. 4A is a schematic cross-sectional side view of a package structure at an intermediate stage of fabrication in which a chip interconnect bridge 110 comprising a pre-applied layer of underfill material 400 and solder bumps 410 is placed within the etched trench and flip-chip bonded to the metallic contacts 308 of the first redistribution layer 300-1 using the solder bumps 410. In this embodiment, the chip interconnect bridge 110 is constructed to have a network of wiring/traces that extend from the bottom surface to the upper surface of the chip interconnect bridge 110 to provide package-to-die connections (e.g., vertical power/ground distribution and/or I/O signal distribution) through the chip interconnect bridge 110.

FIG. 4B is a schematic cross-sectional side view of the package structure of FIG. 4A after forming the additional redistribution layers 330 and 340 over the chip interconnect bridge 110, attaching a plurality of IC chips 140 and 150 to the fifth (uppermost) redistribution layer 340, after removing the carrier substrate 100 to expose the first (bottommost) redistribution layer 300, and forming solder bumps 480 on the contact metallization 304 and 308 of the first redistribution layer 300-1. FIG. 4B illustrates a multi-chip package structure 450 comprising the chip interconnect bridge 110 embedded in a fan-out RDL structure comprising the redistribution 301-1, 310, 320, 330, and 340. In this regard, the multi-chip package structure 450 in FIG. 4B is similar to the multi-chip package structure 350 of FIG. 3E, except that the multi-chip package structure 450 of FIG. 4B comprises additional bottom side interconnects formed between the bottom side of the chip interconnect bridge 110 and the bottom side of the package structure 450, wherein the bottom side interconnects are formed by contacts 308 and solder bumps 410.

Figure 5A:
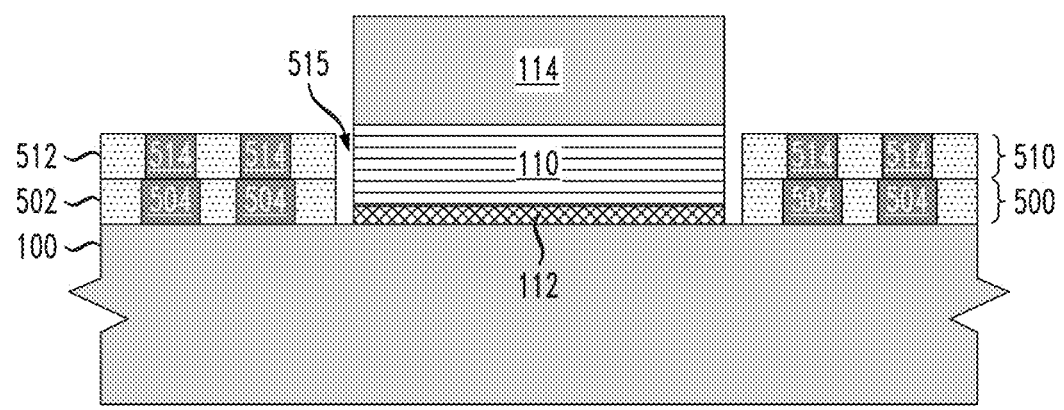
Figure 5B:
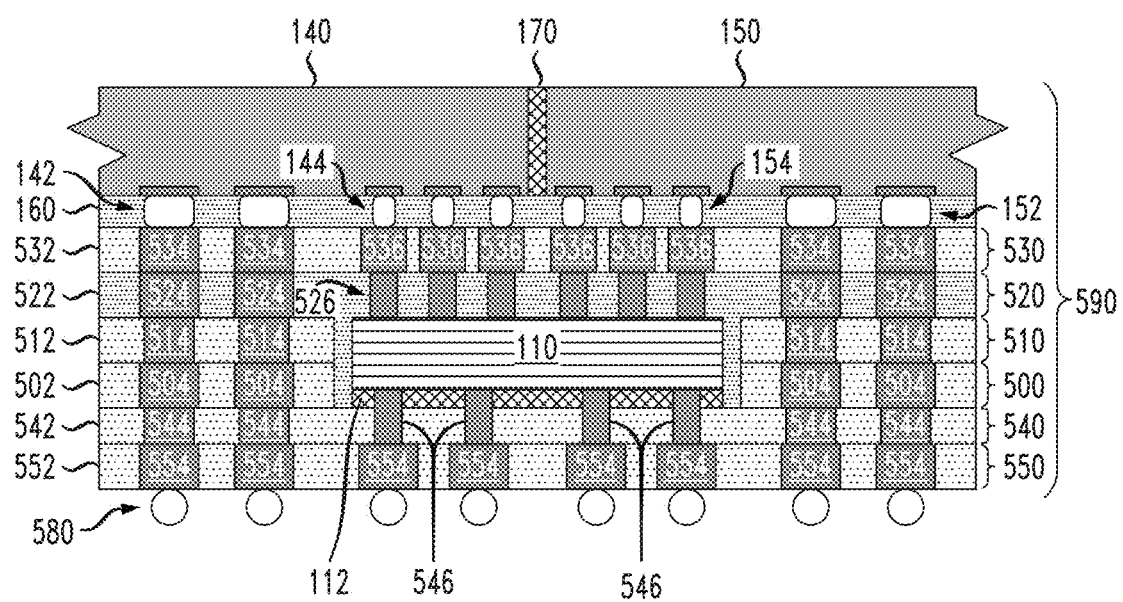

FIGS. 5A and 5B schematically illustrate a process for fabricating a multi-chip package structure according to another embodiment of the disclosure. In general, FIGS. 5A and 5B illustrate an alternative embodiment of the fabrication process of FIGS. 4A through 4B to form bottom side interconnects between the bottom side of the chip interconnect bridge 110 and the bottom side of the package structure. To begin, FIG. 5A is a schematic cross-sectional side view of a package structure at an intermediate stage of fabrication after forming a stack of redistribution layers 500 and 510 over an upper surface of a carrier substrate 100, after etching a trench through the redistribution layers 500 and 510 down to an upper surface of carrier substrate 100, and after bonding a chip interconnect bridge 110 to an exposed surface region of the carrier substrate 100 within the trench.

More specifically, as shown FIG. 5A, a first redistribution layer 500 comprises an insulating layer 502 and metallization 504 formed in the insulating layer 502. A second redistribution layer 510 comprises an insulating layer 512 and metallization 514 formed in the insulating layer 512. The redistribution layers 500 and 510 are formed of the same insulating and metallic materials as discussed above. A trench 515 is formed in a footprint region of the redistribution layers 500 and 510 in which the respective insulating layers 502 and 512 are devoid of metallization 504 and 514. The trench 515 is formed using methods as discussed above in conjunction with FIG. 3B. In this instance, the carrier substrate 100 serves as an etch termination mechanism, wherein the insulating layers 502 and 512 are etched selective to the material of the carrier substrate 100. In this embodiment, the chip interconnect bridge 110 is bonded direction to the surface of the carrier substrate 100 using the DAF layer 112. The bridge handler 114 is removed after the bonding the chip interconnect bridge 110 to the carrier substrate 100. In other embodiments, an etch stop layer is formed on the surface of the carrier substrate 100 prior to formation of the redistribution layers 500 and 510. In instance, the etch stop layer serves to terminate the etch process that is performed to form the trench 515.

FIG. 5B is a schematic cross-sectional side view of the package structure of FIG. 5A after forming additional redistribution layers 520 and 530 over the top-side of the chip interconnect bridge 110, attaching a plurality of IC chips 140 and 150 to an uppermost redistribution layer 530, after removing the carrier substrate 100 to expose the first redistribution layer 500, and forming additional redistribution layers 540 and 550 on the backside the chip interconnect bridge 110 and initial redistribution layer 500. The redistribution layer 520 comprises an insulating layer 522 and metallization 524 and 526 formed in the insulating layer 522. The uppermost redistribution layer 530 comprises an insulating layer 532 and metallization 534 and 536 formed in the insulating layer 532. In some embodiments, the redistribution layers 520 and 530 are similar in structure, function, and material composition, etc., as the redistribution layers 330 and 340 discussed above in conjunction with FIG. 3D, the details of which will not be repeated.

The bottom side redistribution layers 540 and 550 are formed following removal of the carrier substrate 100. The redistribution layer 540 comprises an insulating layer 542 and metallization 544 and 546 formed within the insulating layer 532. The metallization 546 comprises an area array of vertical contacts which are formed in alignment with an area array of contact pads that are exposed on a bottom surface of the chip interconnect bridge 110. As shown in FIG. 5B, the vertical contacts 546 are formed in openings that are etched through the insulating layer 542 and the DAF layer 112. The metallization 544 includes horizontal wiring and vertical interconnects. The redistribution layer 550 comprises an insulating layer 552 and metallization 554 formed within the insulating layer 552. The metallization layer 554 comprises contact pads on which solder bumps 580 are formed. In some embodiments, the DAF layer 112 is removed using a polishing process prior to formation of the insulating layer 542.

FIG. 5B illustrates a multi-chip package structure 590 comprising the chip interconnect bridge 110 embedded in a fan-out RDL structure comprises the redistribution 500, 510, 520, 540, 540, and 550. The multi-chip package structure 590 comprises bottom side interconnects formed between the bottom side of the chip interconnect bridge 110 and the bottom side of the package structure 450, wherein the bottom side interconnects are formed by the vertical contacts 546, contact pads 554, and solder bumps 580. In this embodiment, the chip interconnect bridge 110 is constructed to have a network of wiring/traces that extend from the bottom surface to the upper surface of the chip interconnect bridge 110 to provide package-to-die connections (e.g., vertical power/ground distribution and/or I/O signal distribution) through the chip interconnect bridge 110.

Figure 6A:
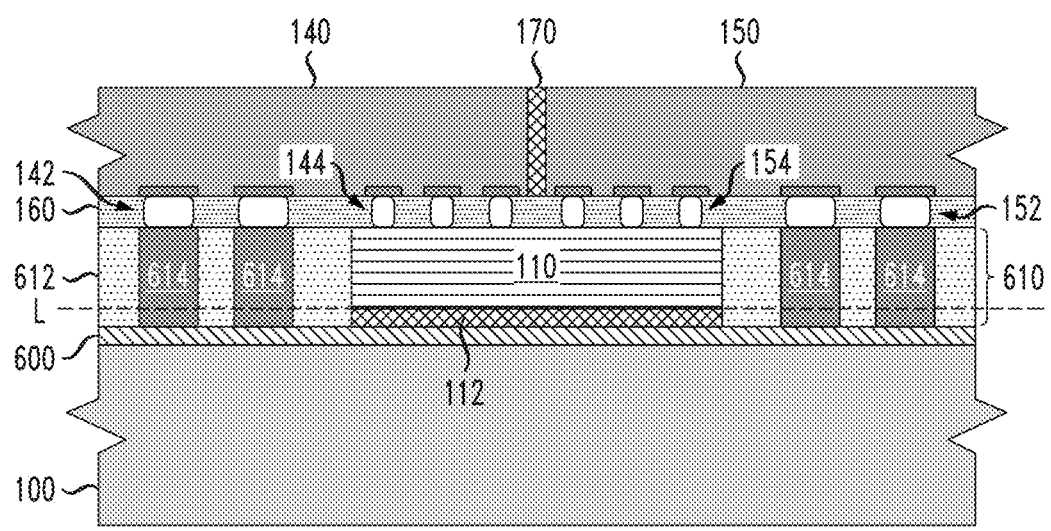
Figure 6B:
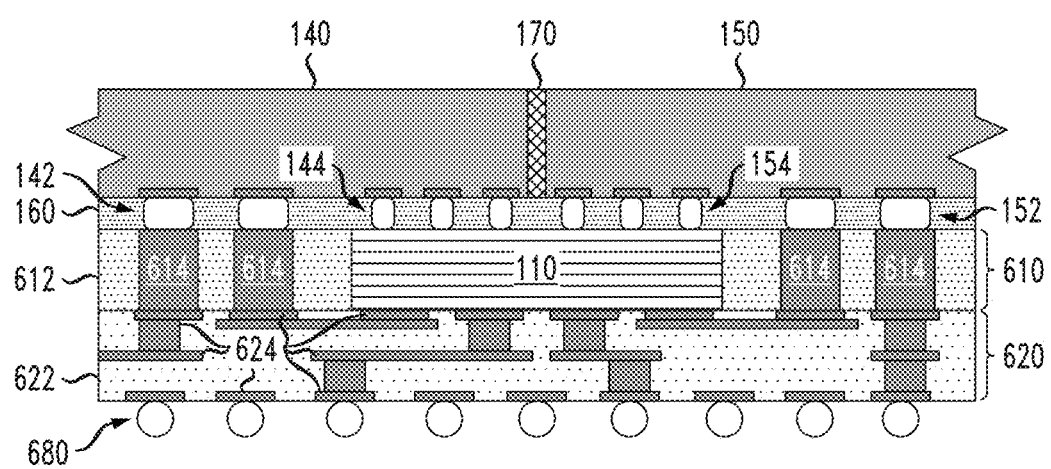

FIGS. 6A and 6B schematically illustrate a process for fabricating a multi-chip package structure according to another embodiment of the disclosure. In general, FIGS. 6A and 6B schematically illustrate a chip-first process in which IC chips are flip-chip bonded to a chip interconnect bridge and metallic pillars, and a fanout RDL structure is formed below the chip interconnection bridge and connected to a bottom side of the chip interconnect bridge and the metallic pillars. In particular, FIG. 6A is a schematic cross-sectional side view of a package structure at an intermediate stage of fabrication wherein a chip interconnect bridge 110 is bonded to an etch stop layer 600 formed on a surface of a carrier substrate 100, wherein the chip interconnect bridge 110 is surrounded by a vertical interconnect layer 610, and wherein a plurality of IC chips 140 and 150 are flip-chip mounted to upper surfaces of the chip interconnect bridge 110 and the vertical interconnect layer 610. The vertical interconnect layer 610 comprises an insulating layer 612 and metallic pillar structures 614 disposed within the insulating layer 612. In some embodiments, the intermediate structure of FIG. 6A is fabricated as follows.

The etch stop layer 600 is formed of an upper surface of the carrier substrate 100. In some embodiments, the etch stop layer 600 serves as an etch termination layer to terminate a backside grind and polish process that is performed to remove the carrier substrate 100 in a later stage of fabrication. In other embodiments, the etch stop layer 600 may comprise an adhesive film that serves as a release layer that can be ablated or vaporized using, e.g., IR laser ablation at a later stage of fabrication to release the carrier substrate 100.

Following formation of the etch stop layer 600, the metallic pillar structures 614 are formed using techniques as discussed above, for example, in conjunction with FIG. 2A. In particular, in some embodiments, a layer of photoresist material is formed over the etch stop layer 600. The layer of photoresist material is developed and patterned to form a photomask with openings that define the metallic pillar structures. The openings of the photomask are filled with a metallic material such as copper to form the metallic pillars 614. The metallic pillars 614 can be formed using any suitable metal deposition process such as electroplating. The photomask is then stripped away using known etch solutions to expose the metallic pillars 614 and the etch stop layer 600.

After removing the photomask, the chip interconnect bridge 110 is bonded to the etch stop layer 600 using techniques as discussed above. As shown in FIG. 6A, the chip interconnect bridge 110 is bonded to a region which is devoid of metallic pillars 614. A layer of dielectric material is then deposited and planarized to form the insulating layer 612 of vertical interconnect layer 610, which encapsulates the metallic pillar structures 614 and surrounds the chip interconnect bridge 110. The insulating layer 612 may comprise an organic film or any suitable dielectric or polymer material. In some embodiments, the insulating layer 612 comprises an epoxy resin which is formed using a standard chip molding process. After forming the vertical interconnect layer 610, the IC chips 140 and 150 are flip-chip bonded to the upper surface of the chip interconnect bridge 110 and upper portions of the metallic pillars 614 using solder bump interconnects 142, 144, 152, and 154, similar to the exemplary embodiments discussed above.

Next, FIG. 6B is a schematic cross-sectional side view of the package structure of FIG. 6A after removing the carrier substrate 100, polishing the backside of the intermediate structure to expose the bottom surface of the chip interconnect bridge 110, and forming a fan-out RDL structure 620 which is connected to bottom surfaces of the chip interconnect bridge 110 and the vertical interconnect layer 610. As shown in FIG. 6B, the fan-out RDL structure 620 comprises multiple levels of insulating material 622 and associated metallization levels 624.

The carrier substrate 100 can be removed by grinding away the carrier substrate 100 down to the etch stop layer 600, which is then followed by a fine polishing process to polish the backside of the package structure to a level indicated by a dashed line L. The polish process serves to remove the DAF layer 112 and make the bottom surface of the vertical interconnect layer 610 planar with the bottom surface of chip interconnect bridge 110. The fan-out RDL structure 620 is then fabricated, layer by layer, on the polished backside surface of the package structure. In some embodiments, such as shown in FIG. 6B, the fan-out RDL structure 620 comprises backside connections to the chip interconnect bridge 110.

Figure 7:
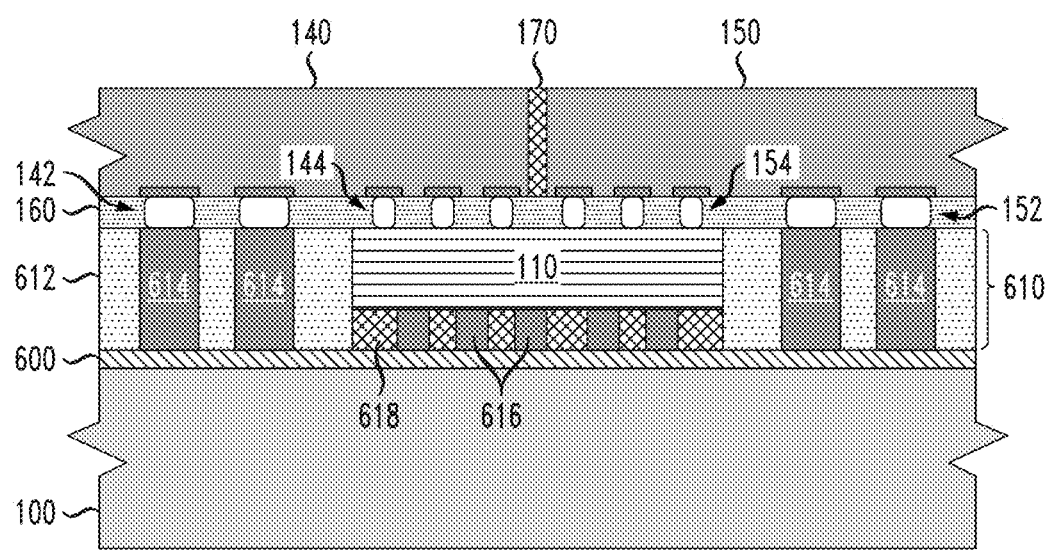
FIG. 7 schematically illustrates a process for fabricating a multi-chip package structure according to another embodiment of the disclosure, wherein FIG. 7 schematically illustrates an alternative embodiment to a chip-first process of FIGS. 6A and 6B.

FIG. 7 schematically illustrates a process for fabricating a multi-chip package structure according to another embodiment of the disclosure. In general, FIG. 7 schematically illustrates an alternative embodiment to the chip-first process of FIGS. 6A and 6B, wherein additional metallic pillar structures 616 are formed on the etch stop layer 600 in a footprint region of the chip interconnect bridge 110. The metallic pillar structures 616 serve as vertical standoff structures which are utilized to ensure that the top surface of the chip interconnect bridge 110 is disposed substantially coplanar with top surfaces of the metallic pillar structures 6143 when the chip interconnect bridge 110 is mounted to the carrier substrate 110. In this instance, a DAF layer 618 (or alternatively, a pre-applied underfill layer 618) is disposed on a bottom surface of the chip interconnect bridge 110 to bond the chip interconnect bridge 110 to the package structure as the chip interconnect bridge 110 is pushed down onto the upper surfaces of the metallic pillars 616.

In other embodiments, the metallic pillar structures 616 also serve as backside contacts which are formed with a sharp tip on upper surfaces thereof. The sharp tips are aligned with contacts pads on the bottom surface of the chip interconnect bridge to form backside connections to the chip interconnect bridge 110.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

We claim:

1. A method for constructing a package structure comprising:
   bonding a chip interconnect bridge to a carrier substrate using a die attach film, wherein the chip interconnect bridge comprises contact pads disposed on a top side of the chip interconnect bridge;
   forming a first fan-out redistribution layer structure which surrounds sidewalls of the chip interconnect bridge and which is disposed over the top side of the chip interconnect bridge;
   direct chip attaching at least a first integrated circuit chip and a second integrated circuit chip to the first fan-out redistribution layer structure, wherein the first fan-out redistribution layer structure comprises input/output connections between the contact pads on the top side of the chip interconnect bridge and the first and second integrated circuit chips;
   removing the carrier substrate to expose a bottom side of the first fan-out redistribution layer structure and the die attach film;
   forming a second fan-out redistribution layer structure on the exposed bottom sides of the first fan-out redistribution layer structure and the die attach film, wherein the second fan-out redistribution layer structure comprises vertical contacts formed through the die attach film in contact with a bottom side of the chip interconnect bridge; and forming solder bumps on a bottom side of the second fan-out redistribution layer structure.

2. The method of claim 1, wherein forming the first fan-out redistribution layer structure comprises:
   forming a first redistribution layer that surrounds the sidewalls of the chip interconnect bridge; and
   forming a second redistribution layer over the first redistribution layer and the top side of the chip interconnect bridge.

3. The method of claim 2, wherein the first redistribution layer comprises an array of via contacts disposed within a first insulating layer.

4. The method of claim 3, wherein the first insulating layer comprises a pre-patterned laminate film which is bonded to the carrier substrate, and which comprises an opening that aligns to a footprint of the chip interconnect bridge.

5. The method of claim 2, wherein forming the first redistribution layer that surrounds the sidewalls of the chip interconnect bridge comprises:
   forming a plurality of metallic pillar structures over a surface of the carrier substrate;
   bonding the chip interconnect bridge to a region of the carrier substrate which is devoid of the metallic pillar structures; and
   forming a dielectric layer which encapsulates the metallic pillar structures and which surrounds the sidewalls of the chip interconnect bridge.

6. The method of claim 1, wherein the first fan-out redistribution layer structure comprises metal lines that are formed with critical dimensions comprising a line width of 8 μm or less, and a line spacing of 8 μm or less a.

7. The method of claim 1, wherein the first integrated circuit chip comprises a processor chip and wherein the second integrated circuit chip comprises a memory chip.

8. The method of claim 1, wherein the first integrated circuit chip comprises a hardware accelerator chip, and wherein the second integrated circuit chip comprises a memory chip.

9. A method for constructing a package structure comprising:
   forming a first stack of redistribution layers on a surface of a carrier substrate;
   forming a trench in the first stack of redistribution layers;
   mounting a chip interconnect bridge within the trench using a die attach film;
   forming a second stack of redistribution layers over the first stack of redistribution layers and a top side of the chip interconnect bridge, wherein the first and second stacks of redistribution layers form a first fan-out redistribution layer structure;
   direct chip attaching at least a first integrated circuit chip and a second integrated circuit chip to an upper surface of the second stack of redistribution layers, wherein the second stack of redistribution layers comprises input/output connections between contact pads on the top side of the chip interconnect bridge and the first and second integrated circuit chips;
   removing the carrier substrate to expose a bottom side of the first fan-out redistribution layer structure and a bottom side of the die attach film; and
   forming a second fan-out redistribution layer structure on the exposed bottom sides of the first fan-out redistribution layer structure and the die attach film, wherein the second fan-out redistribution layer structure comprises vertical contacts formed through the die attach film in contact with a bottom side of the chip interconnect bridge.

10. The method of claim 9, further comprising forming solder bumps on a bottom side of the second fan-out redistribution layer structure.

11. The method of claim 9, wherein forming the trench in the first stack of redistribution layers comprises:
    etching the trench through the first stack of redistribution layers down to the surface of the carrier substrate; and
    bonding the chip interconnect bridge to the surface of the carrier substrate exposed at a bottom of the trench using the die attach film.

12. The method of claim 9, wherein the first integrated circuit chip comprises a processor chip and wherein the second integrated circuit chip comprises a memory chip.

13. The method of claim 9, wherein the first integrated circuit chip comprises a hardware accelerator chip, and wherein the second integrated circuit chip comprises a memory chip.

14. The method of claim 9, wherein the first fan-out redistribution layer structure comprises metal lines that are formed with critical dimensions comprising a line width of 8 μm or less, and a line spacing of 8 μm or less.

15. A method for constructing a package structure comprising:
   forming a first stack of redistribution layers on a surface of a carrier substrate;
   forming a trench in the first stack of redistribution layers;
   mounting a chip interconnect bridge within the trench;
   forming a second stack of redistribution layers over the first stack of redistribution layers and a top side of the chip interconnect bridge, wherein the first and second stacks of redistribution layers form a first fan-out redistribution layer structure;
   direct chip attaching at least a first integrated circuit chip and a second integrated circuit chip to an upper surface of the second stack of redistribution layers, wherein the second stack of redistribution layers comprises input/output connections between contact pads on the top side of the chip interconnect bridge and the first and second integrated circuit chips; and
   removing the carrier substrate to expose a bottom side of the first fan-out redistribution layer structure;
   wherein forming the trench in the first stack of redistribution layers comprises:
   etching a trench through at least one redistribution layer of the first stack of redistribution layers down to a surface of an underlying redistribution layer; and
   bonding the chip interconnect bridge to the surface of the underlying redistribution layer exposed at a bottom of the trench using solder bumps.

16. The method of claim 15, wherein the underlying redistribution layer comprises metallic contacts which form backside connections to a bottom side of the chip interconnect bridge through the solder bumps.

17. The method of claim 15, further comprising forming at least one additional redistribution layer on the exposed bottom side of the first fan-out redistribution layer structure.

18. The method of claim 17, wherein the at least one additional redistribution layer comprises metallic contacts which form backside connections to a bottom side of the chip interconnect bridge.

19. The method of claim 17, further comprising forming solder bumps on a bottom side of the at least one additional redistribution layer.

20. The method of claim 15, wherein the first integrated circuit chip comprises a processor chip and wherein the second integrated circuit chip comprises a memory chip.

* * * * *